United States Patent
Lin

(10) Patent No.: US 10,541,155 B2
(45) Date of Patent: Jan. 21, 2020

(54) NESTED FINNED HEAT SINK WITH HEAT PIPE

(71) Applicant: ASIA VITAL COMPONENTS CO., LTD., New Taipei (TW)

(72) Inventor: Sheng-Huang Lin, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 88 days.

(21) Appl. No.: 15/408,424

(22) Filed: Jan. 18, 2017

(65) Prior Publication Data

US 2018/0200847 A1 Jul. 19, 2018

(51) Int. Cl.
*H01L 21/48* (2006.01)
*H01L 23/367* (2006.01)

(52) U.S. Cl.
CPC ...... *H01L 21/4882* (2013.01); *H01L 23/3672* (2013.01)

(58) Field of Classification Search
CPC .. B23P 15/26; B23P 2700/10; H01L 21/4882; H01L 23/3672; H01L 23/467; H01L 2023/4056; H05K 7/20154; H05K 7/20263; H05K 7/20418; F28D 15/0275; F28D 15/02; F28F 3/025; F28F 2215/04; F28F 2215/08; F28F 2215/12; F28F 1/325; F28F 2225/06
See application file for complete search history.

(56) References Cited

U.S. PATENT DOCUMENTS

| | | | | |
|---|---|---|---|---|
| 3,217,793 A * | 11/1965 | Coe | ........................... | F28F 1/12 165/185 |
| 5,038,858 A * | 8/1991 | Jordan | ................ | H01L 23/3672 165/185 |
| 5,558,155 A * | 9/1996 | Ito | ........................ | B23K 1/0012 165/185 |
| 6,161,610 A * | 12/2000 | Azar | ........................ | F28F 3/02 165/185 |
| 6,301,779 B1 * | 10/2001 | Azar | ....................... | B23P 15/26 165/80.3 |
| 6,321,451 B1 * | 11/2001 | Lee | ........................... | F28F 3/02 165/80.3 |
| 6,883,592 B2 * | 4/2005 | Lee | ..................... | H01L 23/3677 165/185 |
| 7,100,681 B1 * | 9/2006 | Wu | ..................... | F28D 15/0266 165/104.21 |
| 7,443,677 B1 * | 10/2008 | Zhou | ................... | F28D 15/0275 165/104.21 |
| 2006/0289147 A1 * | 12/2006 | Zuo | ..................... | F28D 15/0266 165/104.26 |
| 2010/0328887 A1 * | 12/2010 | Refai-Ahmed | ....... | H01L 23/427 361/697 |

* cited by examiner

*Primary Examiner* — Travis C Ruby
(74) *Attorney, Agent, or Firm* — Jackson IPG PLLC; Demian K. Jackson

(57) ABSTRACT

A nested finned heat sink with heat pipe(s). A heat dissipation unit includes a base seat and a first radiating fin assembly. The first radiating fin assembly includes multiple first radiating fins. Two ends of each first radiating fin are respectively formed with a first end edge and a second end edge on a first side. The respective first radiating fins are nested with height and width gradually increased. Each first radiating fin is formed with at least one first support section and a first opening in a position corresponding to the first support section. The first support section abuts against and supports another first radiating fin.

9 Claims, 9 Drawing Sheets

NESTED FINNED HEAT SINK WITH HEAT PIPE

BACKGROUND OF THE INVENTION

1. Field of the Invention

The present invention relates generally to a heat dissipation unit and a thermal module thereof, and more particularly to a heat dissipation unit, in which the structural strength of the radiating fins is greatly enhanced and the manufacturing cost is lowered and a thermal module of the heat dissipation unit.

2. Description of the Related Art

Due to the advance of sciences and techniques, the operation performance of the electronic components has become higher and higher. As a result, the required heat dissipation efficiency of the heat sink has become higher and higher. In order to increase the heat dissipation effect, most of the conventional heat sinks have employed stacked type of radiating fin assembly. Various improved radiating fins have been continuously developed. Therefore, currently, it has become one of the most important focuses in this field to develop high-performance heat sink.

With a mainframe computer taken as an example, most of the heat generated by the mainframe computer is the heat generated by the central processing unit (CPU) in the mainframe computer. The heat will gradually accumulate to make the temperature rise. This will lead to deterioration of the execution performance of the CPU. Moreover, in case the heat accumulates to an extent exceeding an allowable limit, the computer will crash or even burn down and damage. In addition, in order to solve the problem of electromagnetic radiation, the mainframe computer is generally enclosed in a computer case. This makes it harder to efficiently dissipate the heat. Therefore, it has become a critical issue how to quickly conduct the heat generated by the CPU and the other heat generation components out of the computer case.

Please refer to FIG. 1, which is a perspective view of a conventional heat dissipation unit. In the design of the conventional radiating fin, the radiating fin assembly 1 is mainly composed of multiple radiating fins 11, which are latched with each other. The radiating fins 11 are made of thin metal sheets by means of punching. Two edges of each radiating fin 11 are bent to form two folding sections 111. A latch end 1112 and a latch section 1111 are disposed on each folding section 111. When one radiating fin 11 is stacked on and assembled with another radiating fin 11, the folding section 111 of a forward radiating fin 11 contacts and abuts against a plane face 112 of a rearward radiating fin 11. The latch end 1112 of the forward radiating fin 11 is hooked and latched with the latch section 1111 of the rearward radiating fin 11. Accordingly, the two radiating fins 11 can be connected with each other. However, after multiple radiating fins 11 are stacked and latched with each other, there is no actual supporting force to support the radiating fins 11. Moreover, the radiating fins 11 are made of thin metal sheets by punching and cutting so that the radiating fins 11 are too thin and have insufficient strength. Therefore, when the radiating fins 11 are compressed, the radiating fins 11 are often non-uniformly forced. As a result, the radiating fins 11 are easy to destruct and deform such as bend, twist or the like.

In conclusion, the conventional heat dissipation unit has the following shortcomings:
1. The conventional heat dissipation unit is unable to bear greater compression force.
2. The conventional heat dissipation unit is easy to deform.

It is therefore tried by the applicant to provide a heat dissipation unit and a thermal module thereof to solve the problems existing in the conventional heat dissipation unit.

SUMMARY OF THE INVENTION

It is therefore a primary object of the present invention to provide a heat dissipation unit, in which the structural strength of the radiating fins is greatly enhanced.

It is a further object of the present invention to provide a heat dissipation unit, which is manufactured at lower cost.

It is still a further object of the present invention to provide a heat dissipation unit, which can improve the problem of deformation.

It is still a further object of the present invention to provide a thermal module, in which the structural strength of the radiating fins is greatly enhanced.

It is still a further object of the present invention to provide a thermal module, which is manufactured at lower cost.

It is still a further object of the present invention to provide a thermal module, which can improve the problem of deformation.

To achieve the above and other objects, the heat dissipation unit of the present invention includes a base seat and a first radiating fin assembly. The base seat has a first side and a second side. The first radiating fin assembly is composed of multiple first radiating fins. Two ends of each first radiating fin are respectively formed with a first end edge and a second end edge. The first and second end edges are correspondingly disposed on the first side. The respective first radiating fins are arranged with the height and width gradually increased. The first radiating fin is formed with at least one first support section and a first opening in a position corresponding to the first support section. The first support section correspondingly abuts against and supports another first radiating fin.

The thermal module of the present invention includes a heat dissipation unit and a heat pipe. The heat dissipation unit includes a base seat, a first radiating fin assembly and a second radiating fin assembly. The base seat has a first side and a second side. The first radiating fin assembly is composed of multiple first radiating fins. Two ends of each first radiating fin are respectively formed with a first end edge and a second end edge. The first and second end edges are correspondingly disposed on the first side. The respective first radiating fins are arranged with the height and width gradually increased. The first radiating fin is formed with at least one first support section and a first opening in a position corresponding to the first support section. The first support section correspondingly abuts against and supports another first radiating fin. The second radiating fin assembly is composed of multiple second radiating fins. Two ends of each second radiating fin are respectively formed with a third end edge and a fourth end edge. The third and fourth end edges are correspondingly disposed on the second side. The respective second radiating fins are arranged with the height and width gradually increased. The second radiating fin is formed with at least one second support section and a second opening in a position corresponding to the second support section. The second support section correspondingly abuts against and supports another second radiating fin. The heat pipe has a first end, a second end and a heat conduction section. The first and second ends correspondingly pass through the heat dissipation unit.

According to the structural design of the present invention, the first support section formed on the first radiating fin abuts against and supports another first radiating fin. This can greatly enhance the structural strength of the radiating fins. Moreover, the first radiating fin is integrally formed with the first support section so that not only the structural strength is enhanced, but also the manufacturing cost is lowered.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
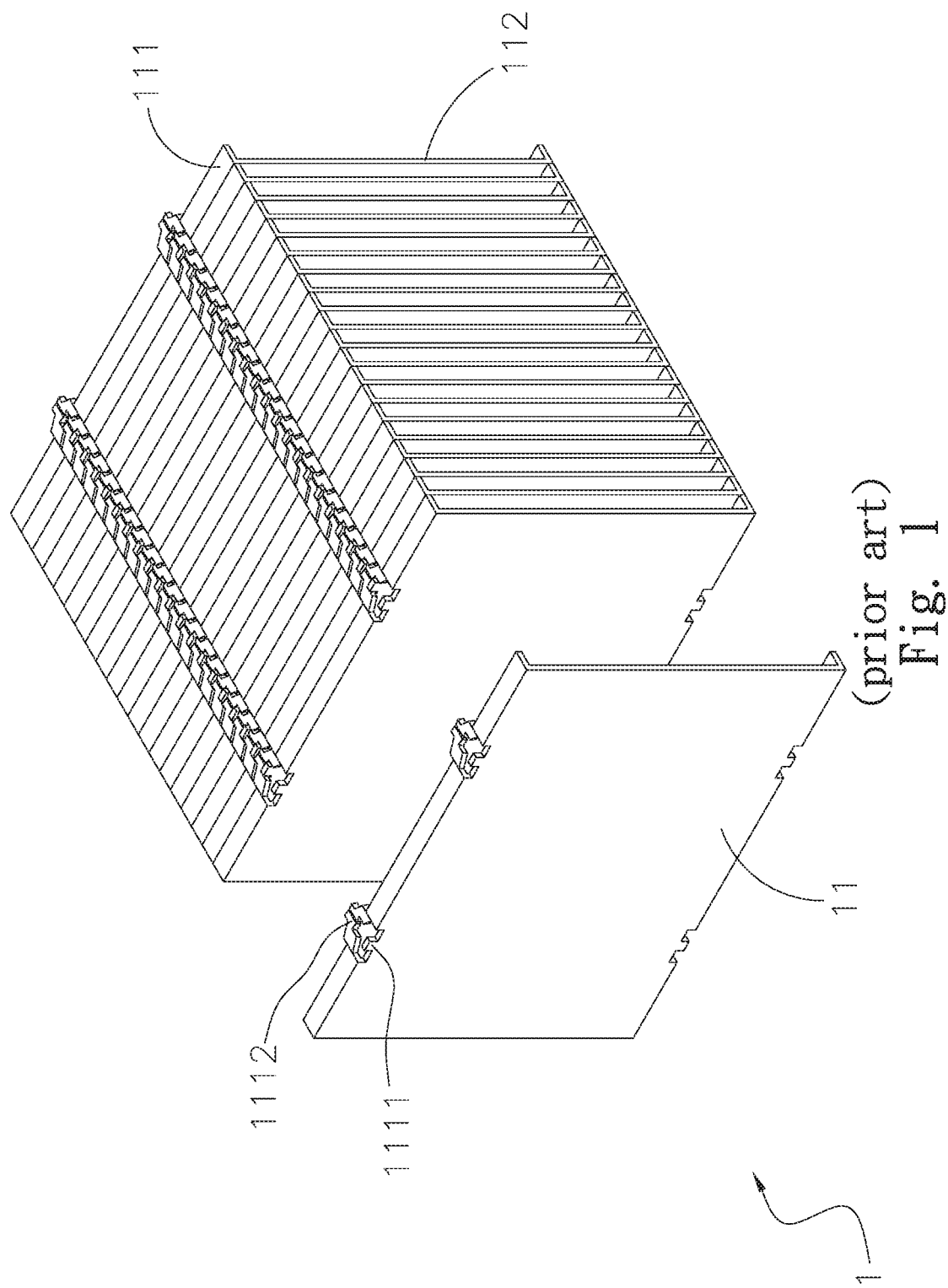
FIG. 1 is a perspective view of a conventional heat dissipation unit.
Figure 2A:
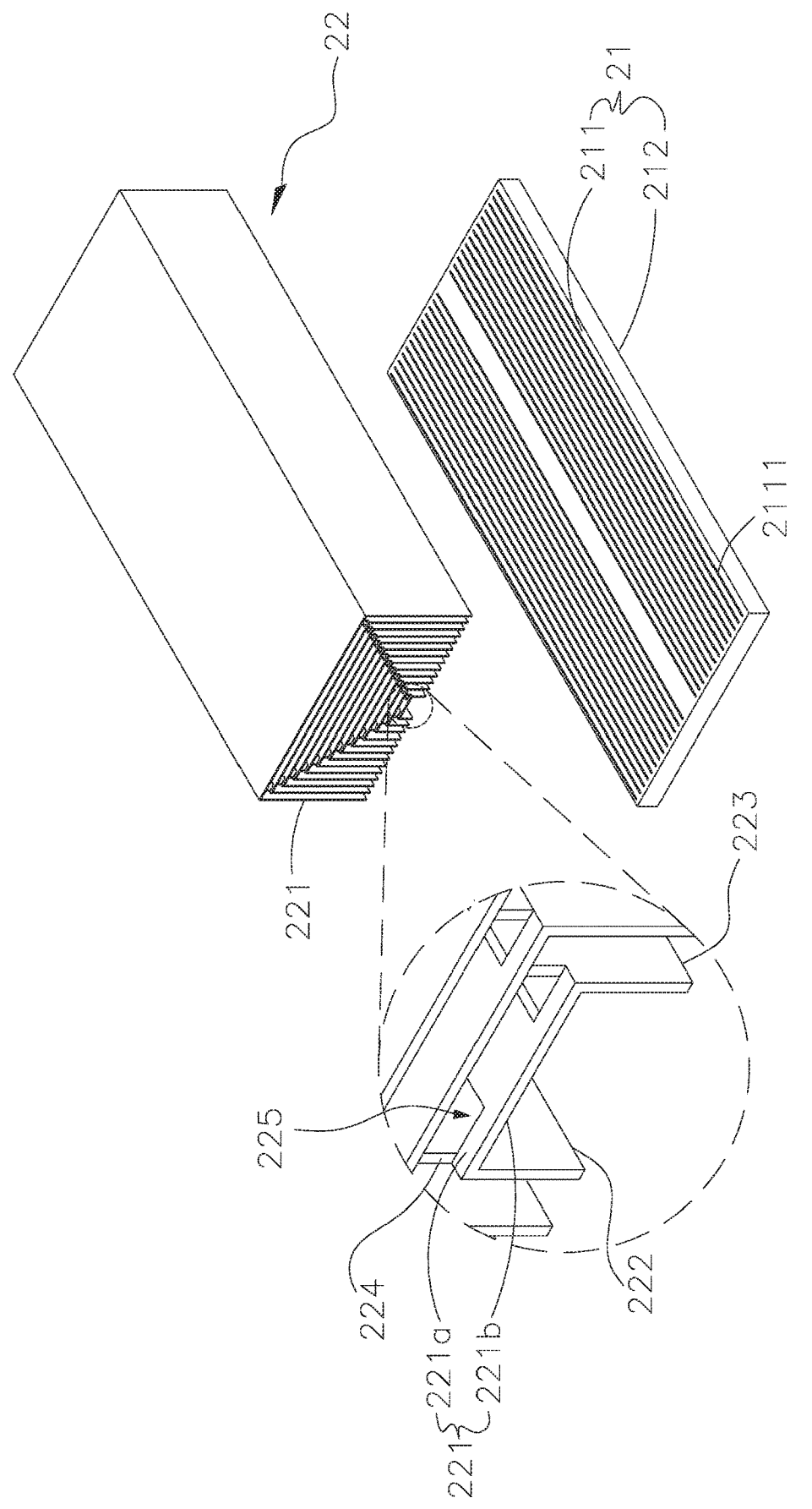
FIG. 2A is a perspective exploded view of a first embodiment of the heat dissipation unit of the present invention.
Figure 2B:
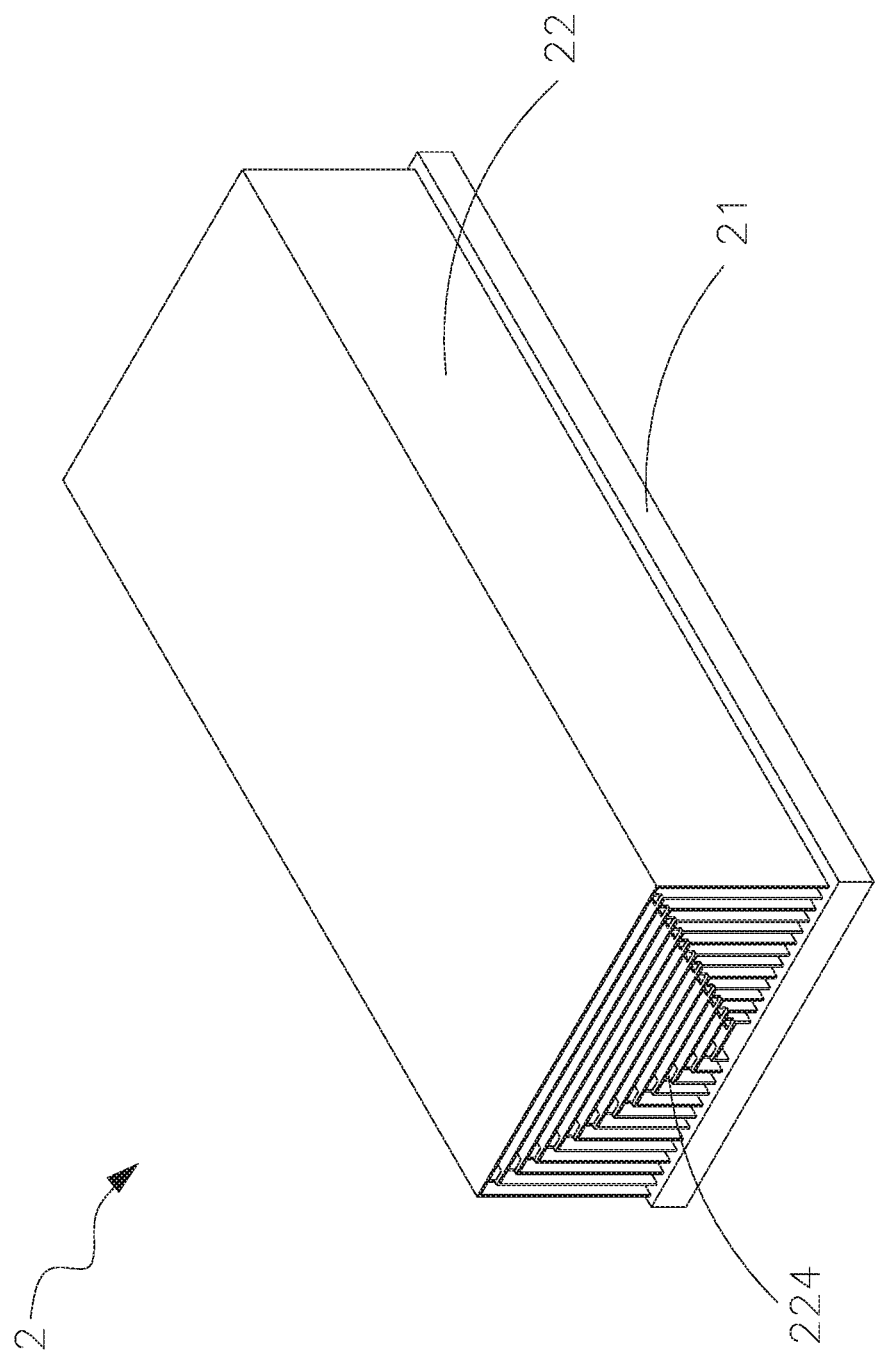
FIG. 2B is a perspective assembled view of the first embodiment of the heat dissipation unit of the present invention.
Figure 3:
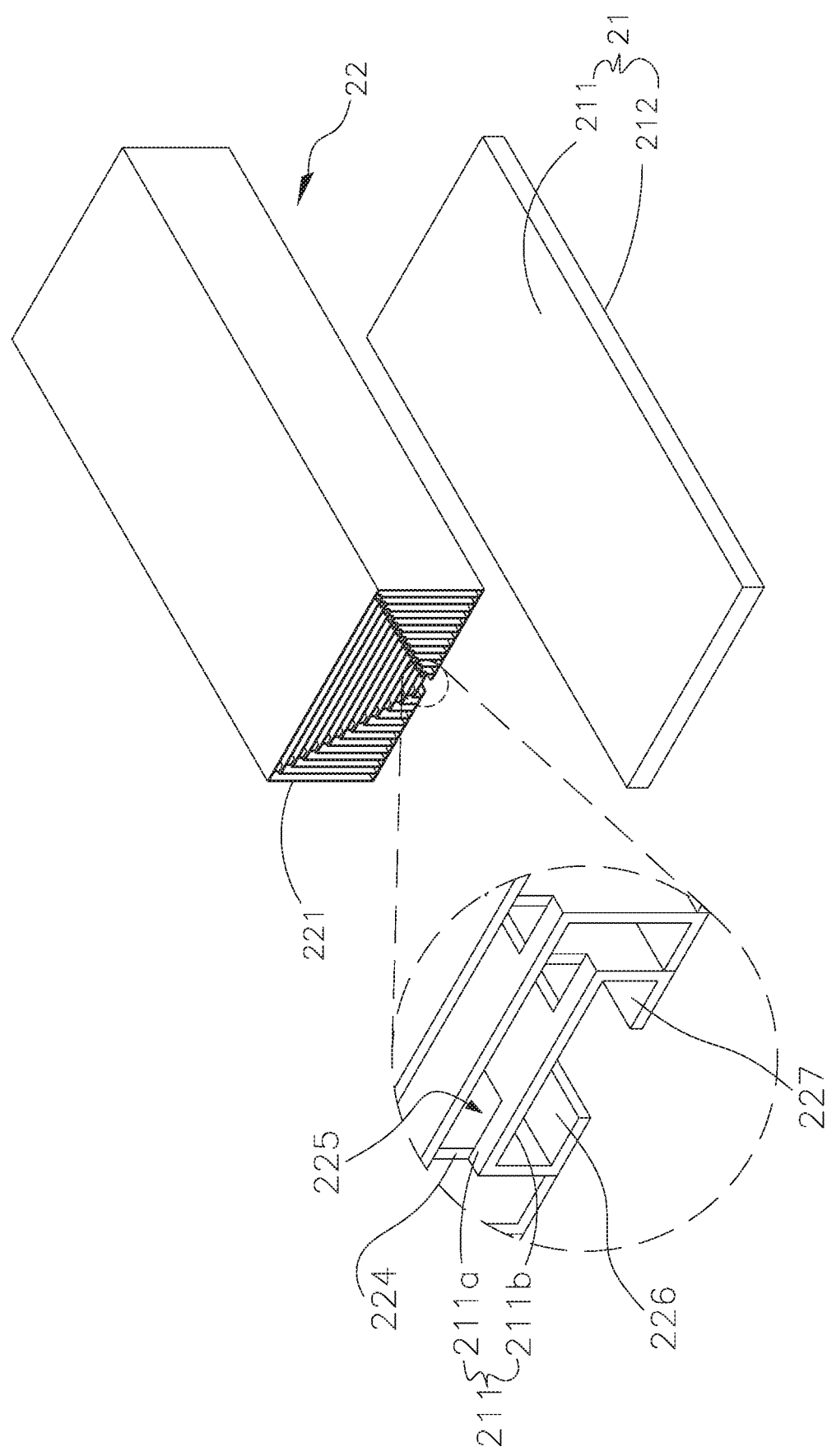
FIG. 3 is a perspective exploded view of a second embodiment of the heat dissipation unit of the present invention.

Please refer to FIGS. 2A and 2B. FIG. 2A is a perspective exploded view of a first embodiment of the heat dissipation unit of the present invention. FIG. 2B is a perspective assembled view of the first embodiment of the heat dissipation unit of the present invention. According to the first embodiment, the heat dissipation unit 2 of the present invention includes a base seat 21 and a first radiating fin assembly 22. The base seat 21 has a first side 211 and a second side 212. In this embodiment, the first side 211 of the base seat 21 is formed with at least one first slot 2111. Alternatively, the first side 211 of the base seat 21 is a plane face as shown in FIG. 3.

The first radiating fin assembly 22 is composed of multiple first radiating fins 221. Two ends of each first radiating fin 221 are respectively formed with a first end edge 222 and a second end edge 223. The first and second end edges 222, 223 are correspondingly inserted in the first slots 2111 of the first side 211. In a second embodiment of the present invention as shown in FIG. 3, the first and second end edges 222, 223 further extend to respectively form a first connection section 226 and a second connection section 227. The first and second connection sections 226, 227 are securely disposed on the first side 211 by means of welding or adhesion.

The respective first radiating fins 221 are arranged from inner side to outer side with the height and width gradually increased. Each first radiating fin 221 further has a first surface 221a and a second surface 221b. The first radiating fin 221 is formed with at least one first support section 224 extending from the second surface 221b to the first surface 221a. The first radiating fin 221 is formed with a first opening 225 in a position corresponding to the first support section 224. The first support section 224 correspondingly abuts against and supports the second surface 221b of another first radiating fin 221.

In this embodiment, the first radiating fin 221 has a rectangular shape. In practice, the shape of the first radiating fin 221 can be changed according to the requirement of a user. In other words, the shape of the first radiating fin 221 can be alternatively semicircular, triangular, polygonal or any other geometric shape (not shown). This will not affect the effect of the present invention. In addition, the number, the position and the size of the first support sections 224 can be adjusted according to the user's requirement. Moreover, the first support sections 224 can be regularly or irregularly arranged on the first surface 221a. In other words, any structural form or manner that can make the first support sections 224 correspondingly abut against and support the second surface 221b of another first radiating fin 221 is included in the scope of the present invention.

According to the structural design of the present invention, the first support section 224 formed on the first radiating fin 221 abuts against and supports the second surface 221b of the other first radiating fin 221. This can improve the problem of the conventional heat dissipation unit that the radiating fins are too thin and have insufficient strength so that when the radiating fins are stacked and compressed, the radiating fins are easy to deform. By means of the structural design of the first support section 224, the structural strength of the radiating fins is greatly enhanced. Moreover, the first radiating fin 221 is integrally formed with the first support section 224 so that not only the structural strength is enhanced, but also the manufacturing cost is lowered.

Figure 4:
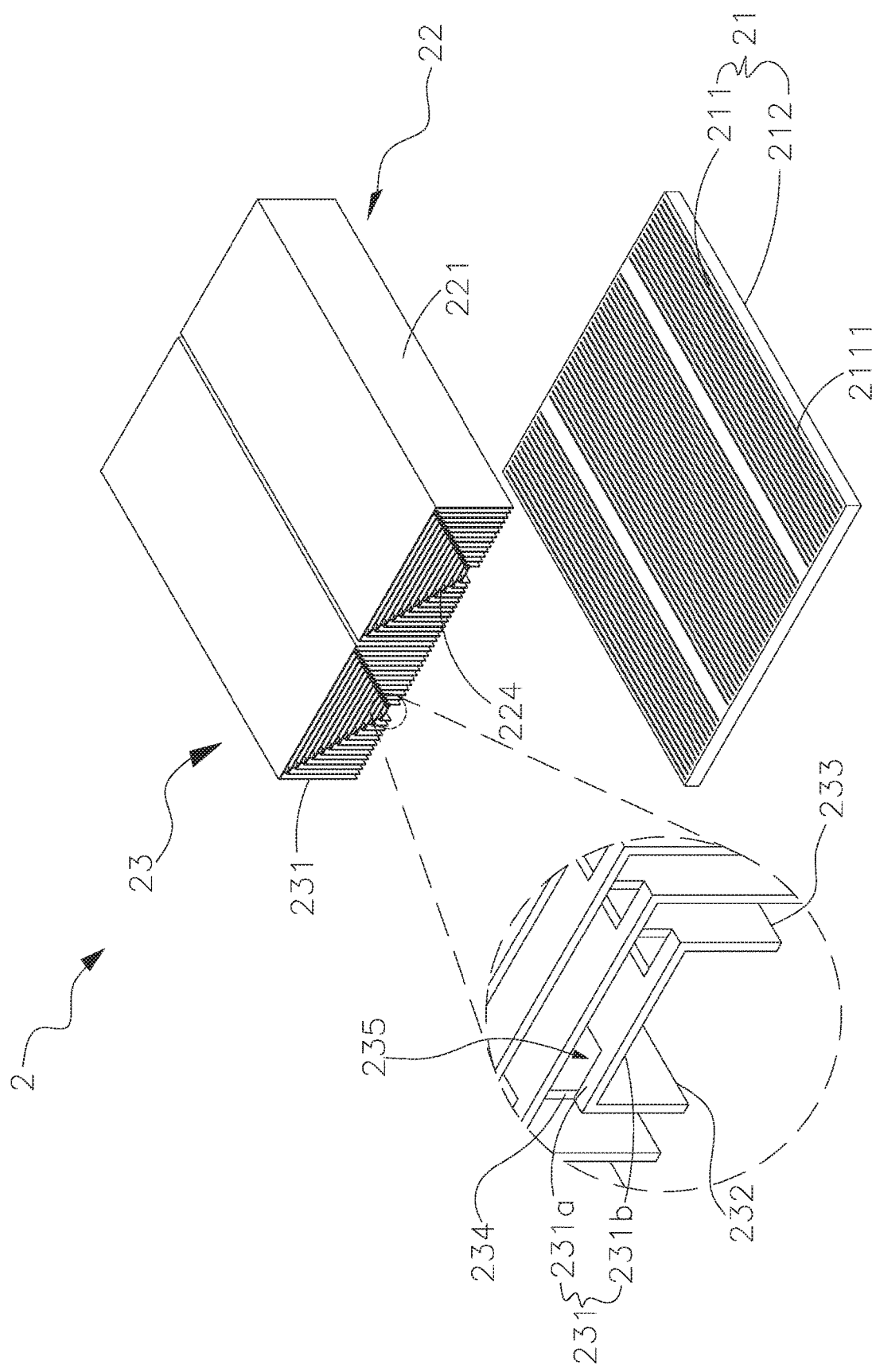
FIG. 4 is a perspective exploded view of a third embodiment of the heat dissipation unit of the present invention.

Please now refer to FIG. 4, which is a perspective exploded view of a third embodiment of the heat dissipation unit of the present invention. The third embodiment is partially identical to the first embodiment in component and relationship between the components and thus will not be repeatedly described hereinafter. The third embodiment is mainly different from the first embodiment in that the heat dissipation unit further has a second radiating fin assembly 23. The second radiating fin assembly 23 is composed of multiple second radiating fins 231. Two ends of each second radiating fin 231 are respectively formed with a third end edge 232 and a fourth end edge 233. The respective second radiating fins 231 are sequentially arranged on the first side 211 from inner side to outer side with the height and width gradually increased. Each second radiating fin 231 further has a third surface 231a and a fourth surface 231b. The second radiating fin 231 is formed with at least one second support section 234 extending from the fourth surface 231b to the third surface 231a. The second radiating fin 231 is formed with a second opening 235 in a position corresponding to the second support section 234. The second support section 234 correspondingly abuts against and supports the fourth surface 231b of another second radiating fin 231. In this embodiment, the first and second radiating fin assemblies 22, 23 are side by side arranged on the first side 211 in adjacency to each other.

In a modified embodiment, at least one fan (not shown) is mated with one side of the heat dissipation unit 2. When the fan forcedly guides airflow into the heat dissipation unit 2, the first and second support sections 224, 234 of the first and second radiating fin assemblies 22, 23 not only will not affect the flowability of the airflow, but also can greatly enhance the structural strength of the radiating fins as aforesaid.

Figure 5:
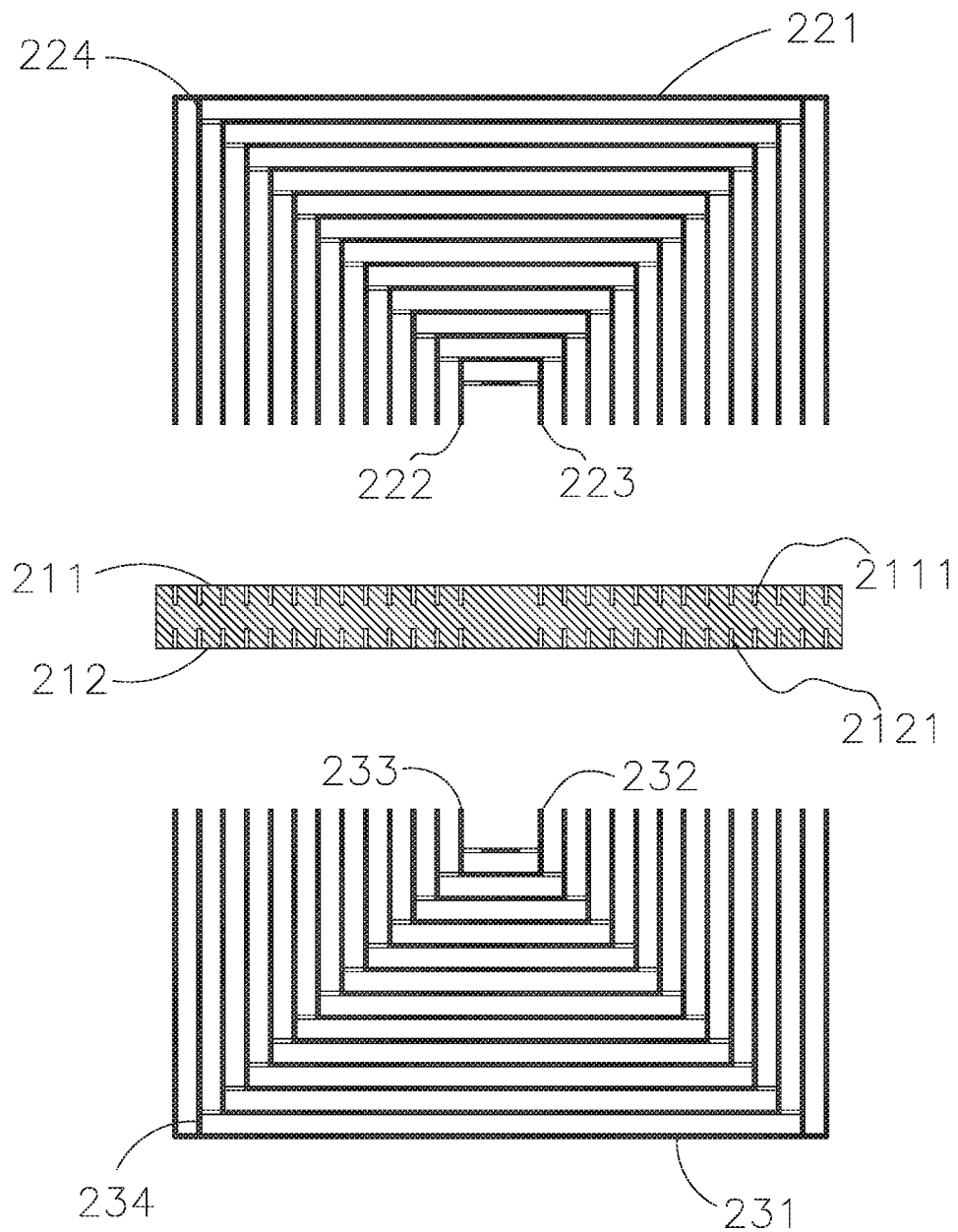
FIG. 5 is a sectional exploded view of a fourth embodiment of the heat dissipation unit of the present invention.

Please now refer to FIG. 5 and supplementally to FIG. 4. FIG. 5 is a sectional exploded view of a fourth embodiment of the heat dissipation unit of the present invention. The fourth embodiment is partially identical to the first embodiment in component and relationship between the components and thus will not be repeatedly described hereinafter. The fourth embodiment is mainly different from the first embodiment in that the second side 212 of the base seat 21 is further formed with at least one second slot 2121. The third and fourth end edges 232, 233 of the second radiating fin 213 are inserted in the second slots 2121. In other words, the first and second radiating fin assemblies 22, 23 are respectively disposed on the first and second sides 211, 212 of the base seat 21.

Figure 6:
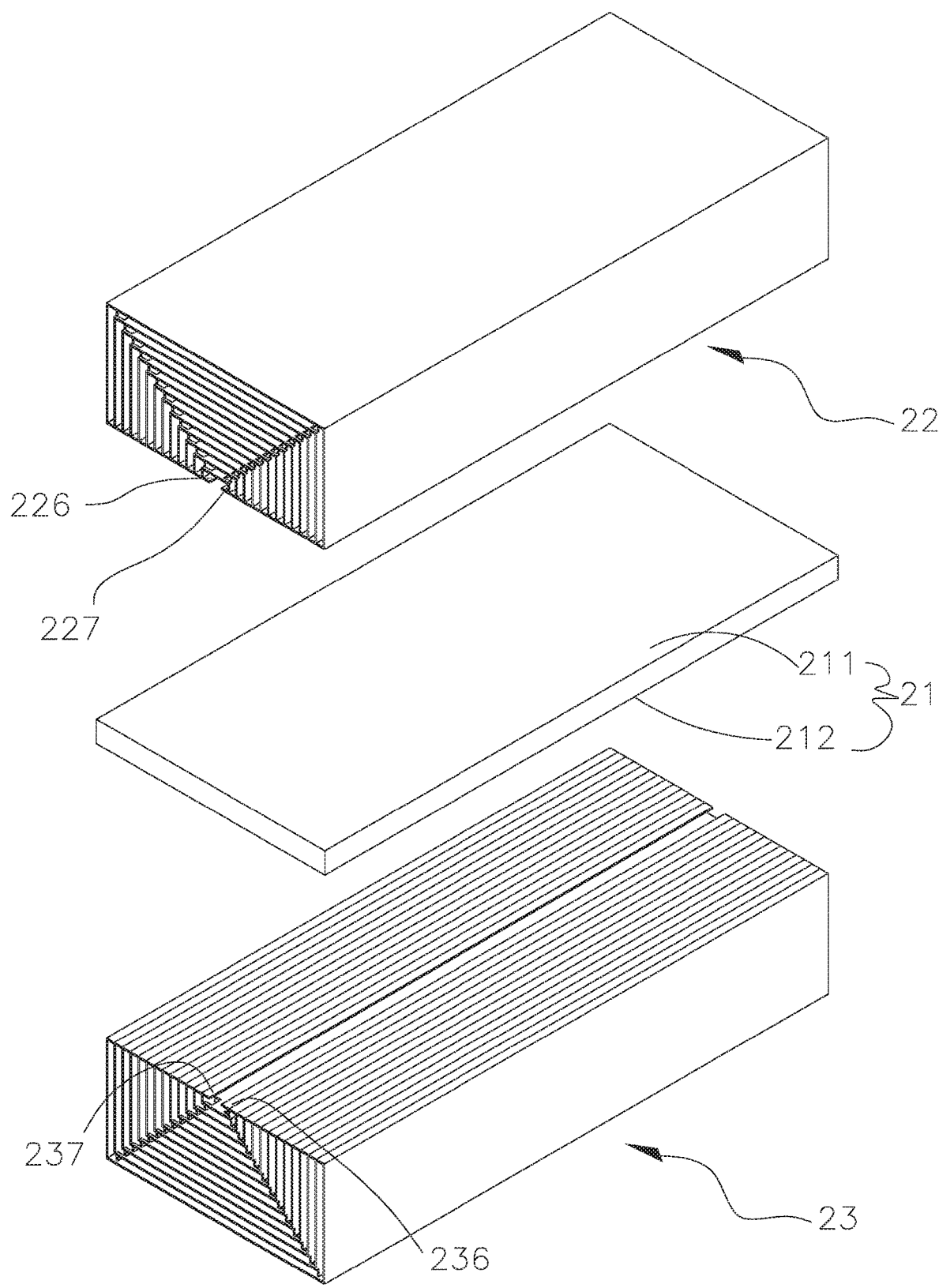
FIG. 6 is a perspective exploded view of a fifth embodiment of the heat dissipation unit of the present invention.

Please now refer to FIG. 5 and supplementally to FIG. 5. FIG. 6 is a perspective exploded view of a fifth embodiment of the heat dissipation unit of the present invention. In the fifth embodiment, the third and fourth end edges 232, 233 further extend to respectively form a third connection section 236 and a fourth connection section 237. The third and fourth connection sections 236, 237 are attached to the second side 212. In other words, the third and fourth connection sections 236, 237 are securely disposed on the second side 212 by means of welding or adhesion. This can achieve the same effect as aforesaid.

Figure 7A:
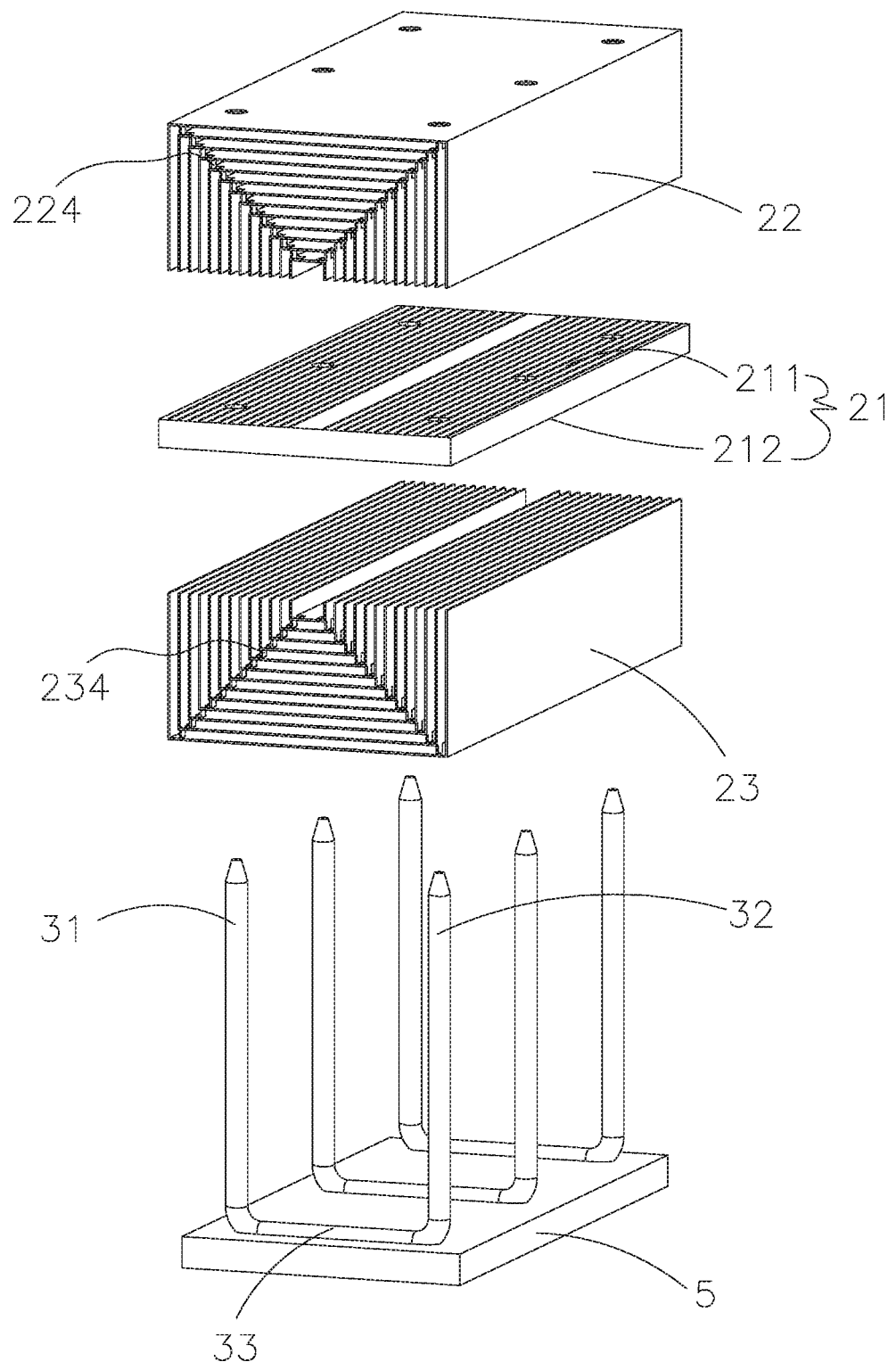
FIG. 7A is a perspective exploded view of a first embodiment of the thermal module of the present invention.
Figure 7B:
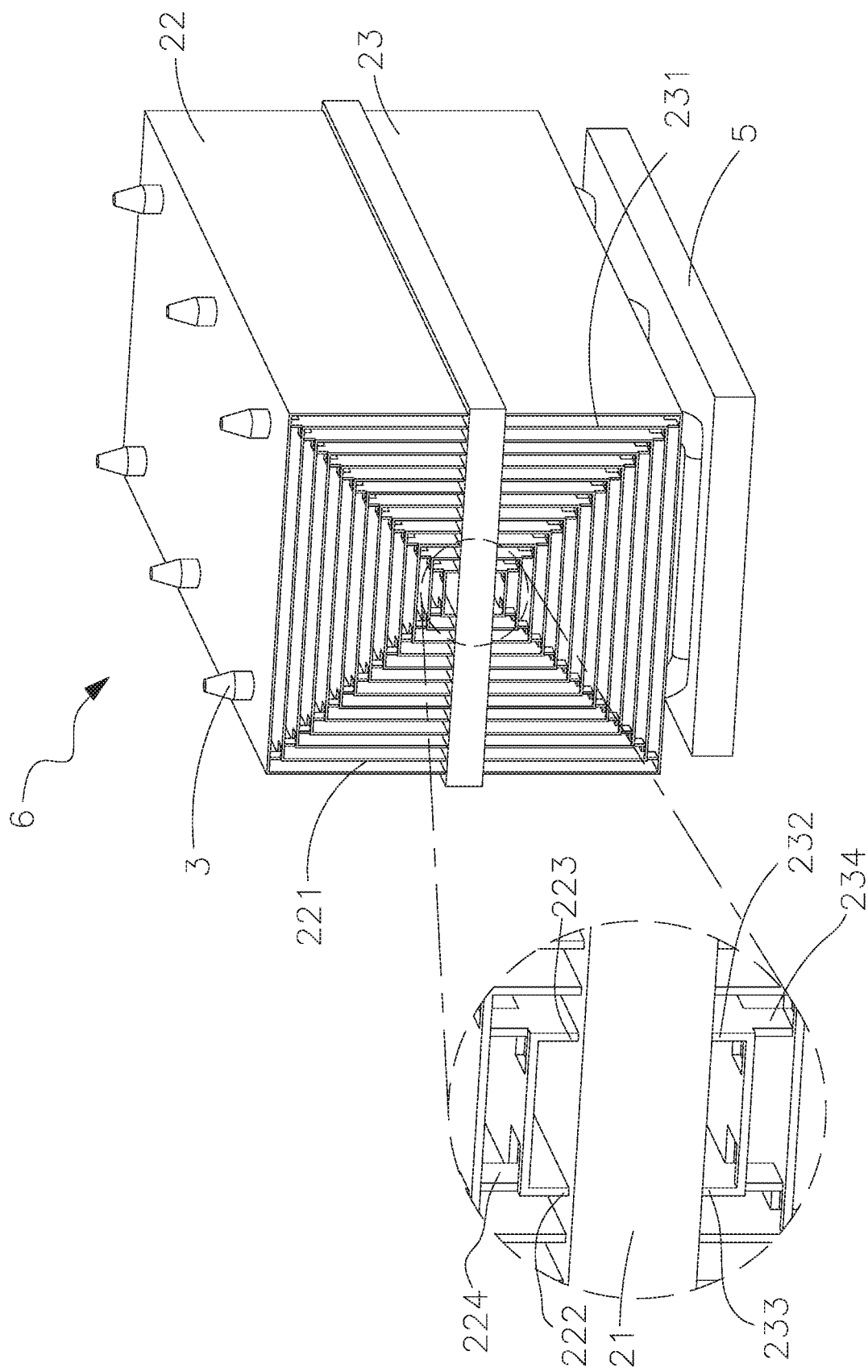
FIG. 7B is a perspective assembled view of the first embodiment of the thermal module of the present invention.

Please now refer to FIGS. 7A and 7B and supplementally to FIGS. 2A and 4. FIG. 7A is a perspective exploded view of a first embodiment of the thermal module of the present invention. FIG. 7B is a perspective assembled view of the first embodiment of the thermal module of the present invention. According to the first embodiment, the thermal module 6 of the present invention includes a heat dissipation unit 2 and a heat pipe 3. The heat dissipation unit 2 includes a base seat 21, a first radiating fin assembly 22 and a second radiating fin assembly 23. The base seat 21 has a first side 211 and a second side 212. In this embodiment, the first and second sides 211, 212 are respectively formed with at least one first slot 2111 and at least one second slot 2121. Alternatively, as shown in FIG. 6, the first and second sides 211, 212 are in the form of a plane face.

The first radiating fin assembly 22 is composed of multiple first radiating fins 221. Two ends of each first radiating fin 221 are respectively formed with a first end edge 222 and a second end edge 223. The first and second end edges 222, 223 are correspondingly inserted in the first slots 2111 of the first side 211. The respective first radiating fins 221 are arranged from inner side to outer side with the height and width gradually increased. Each first radiating fin 221 further has a first surface 221a and a second surface 221b. The first radiating fin 221 is formed with at least one first support section 224 extending from the second surface 221b to the first surface 221a. The first radiating fin 221 is formed with a first opening 225 in a position corresponding to the first support section 224. The first support section 224 correspondingly abuts against and supports the second surface 221b of another first radiating fin 221.

The second radiating fin assembly 22 is composed of multiple second radiating fins 231. Two ends of each second radiating fin 231 are respectively formed with a third end edge 232 and a fourth end edge 233. The respective second radiating fins 231 are arranged on the second side 212 from inner side to outer side with the height and width gradually increased with the third and fourth end edges 232, 233 inserted in the second slots 2121. Each second radiating fin 231 further has a third surface 231a and a fourth surface 231b. The second radiating fin 231 is formed with at least one second support section 234 extending from the fourth surface 231b to the third surface 231a. The second radiating fin 231 is formed with a second opening 235 in a position corresponding to the second support section 234. The second support section 234 correspondingly abuts against and supports the fourth surface 231b of another second radiating fin 231.

In a preferred embodiment, the heat pipe 3 and heat source 5 of FIGS. 7A and 7B are assembled with the heat dissipation unit 2 as shown in FIGS. 5 and 6. The first and second end edges 222, 223 further extend to respectively form a first connection section 226 and a second connection section 227. The third and fourth end edges 232, 233 further extend to respectively form a third connection section 236 and a fourth connection section 237. The first, second, third and fourth connection sections 226, 227, 236, 237 are respectively securely disposed on the first and second sides 211, 212 by means of welding or adhesion.

The heat pipe 3 has a first end 31, a second end 32 and a heat conduction section 33. The first and second ends 31, 32 correspondingly pass through the heat dissipation unit 2. The heat pipe 3 can be U-shaped. The heat conduction section 33 is correspondingly attached to the heat source 5. The heat conduction section 33 serves to absorb and transfer the heat of the heat source 5 to the first and second ends 31, 32. The heat is then transferred to the heat dissipation unit 2 to dissipate.

According to the structural design of the present invention, the first support section 224 formed on the first radiating fin 221 abuts against and supports the second surface 221b of the other first radiating fin 221. The second support section 234 formed on the second radiating fin 231 abuts against and supports the fourth surface 231b of another second radiating fin 231. This can improve the problem of the conventional heat dissipation unit that the radiating fins are too thin and have insufficient strength so that when the radiating fins are stacked and compressed, the radiating fins are easy to deform. By means of the structural design of the first and second support sections 224, 234, the structural strength of the radiating fins is greatly enhanced. Moreover, the first and second radiating fins 221, 231 are integrally formed with the first and second support sections 224, 234 so that not only the structural strength is enhanced, but also the manufacturing cost is lowered.

In conclusion, in comparison with the conventional heat dissipation unit, the present invention has the following advantages:

1. The structural strength of the radiating fins is greatly enhanced.

2. The manufacturing cost is greatly lowered.

3. The problem of deformation is improved.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A heat dissipation unit comprising:
    a base seat having a first side and an opposite second side and
    a first radiating fin assembly composed of multiple first radiating fins, wherein each first radiating fin is folded to form four edges, a first connection section, and a second connection section, coplanar with the first connection section, wherein the edges are defined by the fold lines and wherein a surface of each connection section is correspondingly attached to the first side of the base seat such that two of the four edges are attached to the first side of the base seat and such that the other two edges are distal the base seat, the first radiating fins being arranged from inwardly to outwardly with a height and width gradually increased, each first radiating fin being formed with at least one first support section and a first opening in a position corresponding to the first support section along at least one distal edge, the first support sections and the first and second connection sections correspondingly abutting against adjacent first radiating fins such that the first support sections and the first and second connection sections extend between and interconnect adjacent pairs of first radiating fins to enhance structural stability of the first radiating fin assembly.

2. The heat dissipation unit as claimed in claim 1, wherein each first radiating fin is folded inwardly such that the first and second connection sections extend inwardly towards each other.

3. The heat dissipation unit as claimed in claim 1, wherein the surfaces of the first and second connection sections are securely connected to the first side by welding or adhesion.

4. The heat dissipation unit as claimed in claim 1, wherein each first radiating fin has a first outer surface and a second inner surface, the at least one first support section extending outward from the first outer surface.

5. The heat dissipation unit as claimed in claim 1, wherein each first radiating fin has a rectangular shape, a semicircular shape, a triangular shape, a polygonal shape or any other geometric shape.

6. The heat dissipation unit as claimed in claim 1, further comprising a second radiating fin assembly composed of multiple second radiating fins, wherein each second radiating fin is folded to form four edges, a third connection section, and a fourth connection section, coplanar with the third connection section, wherein the edges are defined by the fold lines and wherein a surface of each of the third and fourth connection sections is correspondingly attached to the second side of the base seat such that two of the four edges are attached to the second side of the base seat and such that the other two edges are distal the base seat, the second radiating fins being arranged from inwardly to outwardly with a height and width gradually increased, each second radiating fin being formed with at least one second support section and a second opening in a position corresponding to the second support section along at least one distal edge, the second support sections and the third and fourth connection sections correspondingly abutting against adjacent second radiating fins such that the second support sections and the third and fourth connection surfaces extend between and interconnect adjacent pairs of second radiating fins to enhance structural stability of the second radiating fin assembly.

7. The heat dissipation unit as claimed in claim 1, wherein at least one fan is disposed on one side of the heat dissipation unit.

8. A thermal module comprising:
    a heat dissipation unit including:
        a base seat having a first side and an opposite second side;
        a first radiating fin assembly composed of multiple first radiating fins, wherein each first radiating fin is folded to form four edges, a first connection section, and a second connection section, coplanar with the first connection section, wherein the edges are defined by the fold lines and wherein a surface of each of the first and second connection sections is correspondingly attached to the first side of the base seat such that two of the four edges are attached to the first side of the base seat and such that the other two edges are distal the base seat, the first radiating fins being arranged from inwardly to outwardly with a height and width gradually increased, each first radiating fin being formed with at least one first support section and a first opening in a position corresponding to the first support section along at least one distal edge, the first support sections and the first and second connection sections correspondingly abutting against adjacent first radiating fins such that the first support sections and the first and second connection sections extend between and interconnect adjacent pairs of first radiating fins to enhance structural stability of the first radiating fin assembly; and
        a second radiating fin assembly composed of multiple second radiating fins, wherein each second radiating fin is folded to form four edges, a third connection section, and a fourth connection section, coplanar with the third connection section, wherein the edges are defined by the fold lines and wherein a surface of each of the third and fourth connection sections is correspondingly attached to the second side of the base seat such that two of the four edges are attached to the second side of the base seat and such that the other two edges are distal the base seat, the second radiating fins being arranged from inwardly to outwardly with a height and width gradually increased, each second radiating fin being formed with at least one second support section and a second opening in a position corresponding to the second support section along at least one distal edge, the second support sections and the third and fourth connection sections correspondingly abutting against adjacent second radiating fins such that the second support sections and the third and fourth connection sections extend between and interconnect adjacent pairs of second radiating fins to enhance structural stability of the second radiating fin assembly; and
    a heat pipe having a first end, an opposite second end, and a heat conduction section, the first and second ends correspondingly passing through the heat dissipation unit.

9. The thermal module as claimed in claim 8, wherein each first and second radiating fin is folded inwardly such that the first and second connection sections extend inwardly towards each other and the third and fourth connection sections extend inwardly towards each other.

* * * * *